United States Patent
Liu et al.

(10) Patent No.: US 10,181,973 B2
(45) Date of Patent: Jan. 15, 2019

(54) TRELLIS SHAPING ON LDPC-CODED MODULATION DMT SYSTEMS

(71) Applicant: Futurewei Technologies, Inc., Plano, TX (US)

(72) Inventors: Ruosi Liu, Shenzhen (CN); Jianhua Liu, Shenzhen (CN); Bin Zhou, Shenzhen (CN); Kofi Anim-Appiah, Morgan Hill, CA (US); Amir H. Fazlollahi, San Jose, CA (US)

(73) Assignee: Futurewei Technologies, Inc., Plano, TX (US)

( * ) Notice: Subject to any disclaimer, the term of this patent is extended or adjusted under 35 U.S.C. 154(b) by 31 days.

(21) Appl. No.: 15/176,375

(22) Filed: Jun. 8, 2016

(65) Prior Publication Data

US 2016/0366005 A1 Dec. 15, 2016

Related U.S. Application Data (60) Provisional application No. 62/175,104, filed on Jun. 12, 2015.

(51) Int. Cl.
*H04L 27/36* (2006.01)
*H04L 1/00* (2006.01)
(Continued)

(52) U.S. Cl.
CPC ......... *H04L 27/36* (2013.01); *H03M 13/1102* (2013.01); *H03M 13/23* (2013.01);
(Continued)

(58) Field of Classification Search
CPC ... H04L 1/006; H04L 1/0071; H04L 27/3405; H04L 27/3416; H04L 1/007;
(Continued)

(56) References Cited

U.S. PATENT DOCUMENTS

2001/0031017 A1* 10/2001 Betts ................... H04L 27/2601
375/265
2002/0031190 A1* 3/2002 Ophir ................... H04L 1/0042
375/265

(Continued)

FOREIGN PATENT DOCUMENTS

| CN | 1933522 A | 3/2007 |
|---|---|---|
| CN | 101040499 A | 9/2007 |
| EP | 1248426 A2 | 10/2002 |

OTHER PUBLICATIONS

Costello, Jr., D.J., et al, "Channel Coding: The Road to Channel Capacity," Proceedings of the IEEE, vol. 95, No. 6, Jun. 2007, pp. 1150-1177.

(Continued)

*Primary Examiner* — Michelle M Koeth
(74) *Attorney, Agent, or Firm* — Conley Rose, P.C.

(57) ABSTRACT

A transmitter in a Digital Subscriber Line (DSL) system includes a rate encoder configured to generate a first set of encoded bits using a set of least significant bits, a trellis shaper configured to generate a second set of encoded bits using a most significant bit and the first set of encoded bits, a first constellation mapper configured to generate a first point described by integer coordinates in a complex plane based on the first set of encoded bits obtained from the rate encoder, a second constellation mapper configured to generate a second point described by integer coordinates in the complex plane after interleaving two bits from the second set of encoded bits obtained from the trellis shaper, and a merger module configured to merge the first point with the second point to generate a symbol. The symbol represents a third point described by integer coordinates in the complex plane.

20 Claims, 8 Drawing Sheets

(51) Int. Cl.
*H03M 13/11* (2006.01)
*H03M 13/23* (2006.01)
*H04B 3/52* (2006.01)
*H03M 13/25* (2006.01)

(52) U.S. Cl.
CPC ............ *H03M 13/255* (2013.01); *H04B 3/52* (2013.01); *H04L 1/006* (2013.01); *H04L 1/007* (2013.01); *H04L 1/0041* (2013.01); *H04L 1/0057* (2013.01)

(58) Field of Classification Search
CPC ..... H04L 1/0057; H04L 1/0041; H04L 27/36; H04L 27/03; H03M 13/256; H03M 13/255; H03M 13/258; H03M 13/2792; H03M 13/27; H03M 13/23; H03M 13/1102; H04B 3/52
See application file for complete search history.

(56) References Cited

U.S. PATENT DOCUMENTS

| | | | |
|---|---|---|---|
| 2003/0039318 A1* | 2/2003 | Tong | H03M 13/258 375/298 |
| 2003/0120990 A1* | 6/2003 | Elbwart | H04L 1/1812 714/748 |
| 2005/0010853 A1 | 1/2005 | Duvant et al. | |
| 2006/0078062 A1 | 4/2006 | Pons et al. | |
| 2006/0092050 A1* | 5/2006 | Djokovic | H03M 13/253 341/50 |

OTHER PUBLICATIONS

Eleftheriou, E., et al, "G.gen: LDPC codes for G.dmt.bis and G.lite.bis," ITU-Telecommunication Standardization Sector, Study Group 15, CF-060, Jan. 8, 2001, Clearwater, Florida, 6 pages.
Forney, Jr., G.D., et al, "The V.34 High-Speed Modem Standard," IEEE Communications Magazine, Dec. 1996, pp. 28-33.
Gallager, R.G., "Low-Density Parity-Check Codes," Cambridge, Massachusetts, Jul. 1963, 90 pages.
Foreign Communication From A Counterpart Application, PCT Application No. PCT/CN2016/085477, International Search Report dated Aug. 29, 2016, 7 pages.
Foreign Communication From A Counterpart Application, PCT Application No. PCT/CN2016/085477, Written Opinion dated Aug. 29, 2016, 4 pages.
Forney, G., "Trellis Shaping," IEEE Transactions on Information Theory, XP000257683, vol. 38, No. 2, PT.01, Mar. 1992, pp. 281-300.
Wachsmann, U., et al., "Multilevel Codes: Theoretical Concepts and Practical Design Rules," XP002187530, IEEE Transactions on Information, Theory, vol. 45, No. 5, Jul. 1999, pp. 1361-1391.
Limpaphayom, P., et al., "Power- and Bandwidth-Efficient Communications Using LDPC Codes," IEEE Transactions on Communications, vol. 52, No. 3, Mar. 2004, pp. 350-354.
Valenti, M., et al., "Constellation Shaping for Bit-Interleaved LDPC Coded APSK," XP011469144, IEEE Transaction on Communications, vol. 60, No. 10, Oct. 2012, pp. 2960-2970.
Foreign Communication From A Counterpart Application, European Application No. 16806877.3, Extended European Search Report dated Jun. 5, 2018, 8 pages.

* cited by examiner

TRELLIS SHAPING ON LDPC-CODED MODULATION DMT SYSTEMS

CROSS-REFERENCE TO RELATED APPLICATIONS

The present application claims priority to U.S. Provisional Patent Application 62/175,104 filed Jun. 12, 2015, by Ruosi Liu, et al., and entitled "Trellis Shaping on LDPC-Coded Modulation DMT Systems," which is incorporated by reference.

STATEMENT REGARDING FEDERALLY SPONSORED RESEARCH OR DEVELOPMENT

Not applicable.

REFERENCE TO A MICROFICHE APPENDIX

Not applicable.

BACKGROUND

It is well known from communication theory that the non-uniform use of a signal constellation may result in a "shaping" gain. This is due to the reduced average transmission power that results from less-frequent use of constellation points with high energy. The constellation signal may have a Gaussian distribution to achieve capacity in an Additive White Gaussian Noise Channel (AWGNC).

The benefits of a shaping gain are similar to those for a coding gain. For example, less transmitter power, which equates to a less expensive transmitter, is obtained with the same system performance (e.g., the data rate at a given signal-to-noise ratio (SNR)). Alternatively, greater system performance can be achieved for the same transmitter power.

Signal-processing systems that utilize shaping gain may be less complex than other signal processing methods, yet still achieve an incremental performance gain (e.g., about one decibel (dB)) without the need for more iterations by an iterative decoder or for a more powerful code.

Shaping gain has been used in voice-band modems, but only with trellis-coded modulation (TCM). Unfortunately, obtaining a shaping gain is not a straight-forward process in Digital Subscriber Line (DSL) systems using Low Density Parity Check (LDPC)-coded modulation (LCM).

SUMMARY

In one embodiment, the disclosure includes a transmitter in a Digital Subscriber Line (DSL) system including a rate encoder configured to generate a first set of encoded bits using a set of least significant bits, wherein the first set of encoded bits contains at least one more bit than the set of least significant bits, a trellis shaper operably coupled to the rate encoder, wherein the trellis shaper is configured to generate a second set of encoded bits using a most significant bit and the first set of encoded bits, a first constellation mapper operably coupled to the rate encoder, wherein the first constellation mapper is configured to generate a first point described by integer coordinates in a complex plane based on the first set of encoded bits obtained from the rate encoder, a second constellation mapper operably coupled to the trellis shaper, wherein the second constellation mapper is configured to generate a second point described by integer coordinates in the complex plane after interleaving two bits from the second set of encoded bits obtained from the trellis shaper, and a merger module operably coupled to the first constellation mapper and the second constellation mapper, wherein the merger module is configured to merge the first point with the second point to generate a symbol, wherein the symbol represents a third point described by integer coordinates in the complex plane.

In an embodiment, the interleaving comprises swapping a position of the two bits in the second set of encoded bits. In an embodiment, the interleaving comprises swapping a position of the two bits in the second set of encoded bits while positions of all remaining bits are unchanged. In an embodiment, at least one extra bit in addition to the set of least significant bits and the most significant bit is fed into the trellis shaper and the second constellation mapper but not the rate encoder. In an embodiment, the symbol generated by the merger module contains more bits than the set of least significant bits and the most significant bit combined. In an embodiment, the rate encoder is a Low Density Parity Check (LDPC) ¾ rate encoder and the trellis shaper is a ½ rate trellis shaper. In an embodiment, the first constellation mapper and the second constellation mapper each apply Gray coded bit mapping to generate the first point and the second point, and wherein each of the first point and the second point is two-dimensional. In an embodiment, the symbol is used to generate a constellation mapping utilized for transmitting data in the DSL system.

In another embodiment, the disclosure includes a method of generating a constellation mapping in a transmitter including converting a bitstream into a set of least significant bits and a most significant bit, generating a first set of encoded bits based on the set of least significant bits, wherein the first set of encoded bits contains one more bit than the set of least significant bits, generating a second set of encoded bits based on the most significant bit, generating a first point described by integer coordinates in a complex plane based on the first set of encoded bits, interleaving two bits from the second set of encoded bits to generate an interleaved set of encoded bits and generating a second point described by integer coordinates in the complex plane based on the interleaved set of encoded bits, and merging the first point with the second point to produce a symbol, wherein the symbol represents a third point described by integer coordinates in the complex plane.

In an embodiment, the interleaving comprises swapping a position of the two bits in the second set of encoded bits. In an embodiment, the interleaving comprises swapping a position of the two bits in the second set of encoded bits while positions of all remaining bits are unchanged. In an embodiment, the method further comprises converting the bitstream into one or more additional bits and using the one or more additional bits for constellation mapping and trellis shaping. In an embodiment, a first constellation mapper and a second constellation mapper each apply Gray coded bit mapping to generate the first point and the second point, and wherein each of the first point and the second point is two-dimensional. In an embodiment, the converting is performed by a serial to parallel converter, wherein the generating the first set of encoded bits is performed by a first rate encoder, wherein the generating the second set of encoded bits is performed by a second rate encoder, wherein the generating the first point is performed by a first constellation mapper, wherein the interleaving the two bits is performed by a second constellation mapper, and wherein the merging is performed by a merging device. In an embodiment, the method further comprises using the symbol to generate a constellation mapping utilized for transmitting data in a Digital Subscriber Line (DSL) system.

In yet another embodiment, the disclosure includes a transmitter in a Digital Subscriber Line (DSL) system including a demultiplexer configured to convert a bitstream into a set of least significant bits, a most significant bit, and at least one extra bit, a rate encoder operably coupled to the demultiplexer, wherein the rate encoder is configured to generate a first set of encoded bits using the set of least significant bits, wherein the first set of encoded bits contains at least one more bit than the set of least significant bits, a trellis shaper operably coupled to the demultiplexer and the rate encoder, wherein the trellis shaper is configured to generate a second set of encoded bits using the most significant bit, the at least one extra bit, and the first set of encoded bits, a first constellation mapper operably coupled to the rate encoder, wherein the first constellation mapper is configured to generate a first point described by integer coordinates in a complex plane based on the first set of encoded bits obtained from the rate encoder, a second constellation mapper operably coupled to the trellis shaper, wherein the second constellation mapper is configured to generate a second point described by integer coordinates in the complex plane based on the second set of encoded bits and the at least one extra bit after interleaving two bits from the second set of encoded bits, and a merger module operably coupled to the first constellation mapper and the second constellation mapper, wherein the merger module is configured to merge the first point with the second point to generate a symbol, wherein the symbol represents a third point described by integer coordinates in the complex plane.

In an embodiment, the interleaving comprises swapping a position of the two bits in the second set of encoded bit. In an embodiment, the interleaving comprises swapping a position of the two bits in the second set of encoded bits while positions of all remaining bits remain the same. In an embodiment, the rate encoder is a Low Density Parity Check (LDPC) ¾ rate encoder and the trellis shaper is a ½ rate trellis shaper. In an embodiment, the set of least significant bits and the most significant bit comprise at least four total bits, and wherein the merger module is configured to output two bits more than output by the demultiplexer due to the ½ rate of the trellis shaper and the ¼ rate of the rate encoder. In an embodiment, the first constellation mapper and the second constellation mapper each apply Gray coded bit mapping to generate the first point and the second point, and wherein the first point and the second point are two-dimensional. In an embodiment, the symbol is used to generate a constellation mapping utilized for transmitting data in the DSL system.

For the purpose of clarity, any one of the foregoing embodiments may be combined with any one or more of the other foregoing embodiments to create a new embodiment within the scope of the present disclosure.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Obtaining a shaping gain in a communication system employing DMT or OFDM modulation, such as a DSL system, using LCM is not a straight-forward process. Provided herein is a system and method of combining trellis shaping with LCM for Discrete Multi-Tone (DMT) systems in order to achieve a desirable shaping gain. For example, a shaping gain of up to 0.7 dB may be achieved depending on the constellation.

Disclosed herein is a method for combining trellis shaping and LCM for use in DMT quadrature amplitude-phase modulation (QAM) systems to improve system performance. To obtain regional shaping gain, bit interleaving is used to address a Gray-code labeled signal-point constellation. While the examples provided herein discuss constellations addressed with a number of bits ranging from four to fifteen, more bits could be used if desired. The method, however, is generally not used to obtain a shaping gain for LCM systems with constellations addressed with fewer than four bits because the combination of the trellis shaper (½) and LDPC encoder (at least a ½ coder) generates at least four bits to be mapped into a channel symbol. Therefore, a 4-bit constellation is the smallest that can be addressed with this trellis shaper and LCM encoder. Throughout this disclosure we will describe the operation of this shaper for a rate ¾ LDPC encoder that will limit the shaping gain to a minimum 6-bit constellation.

Figure 1:
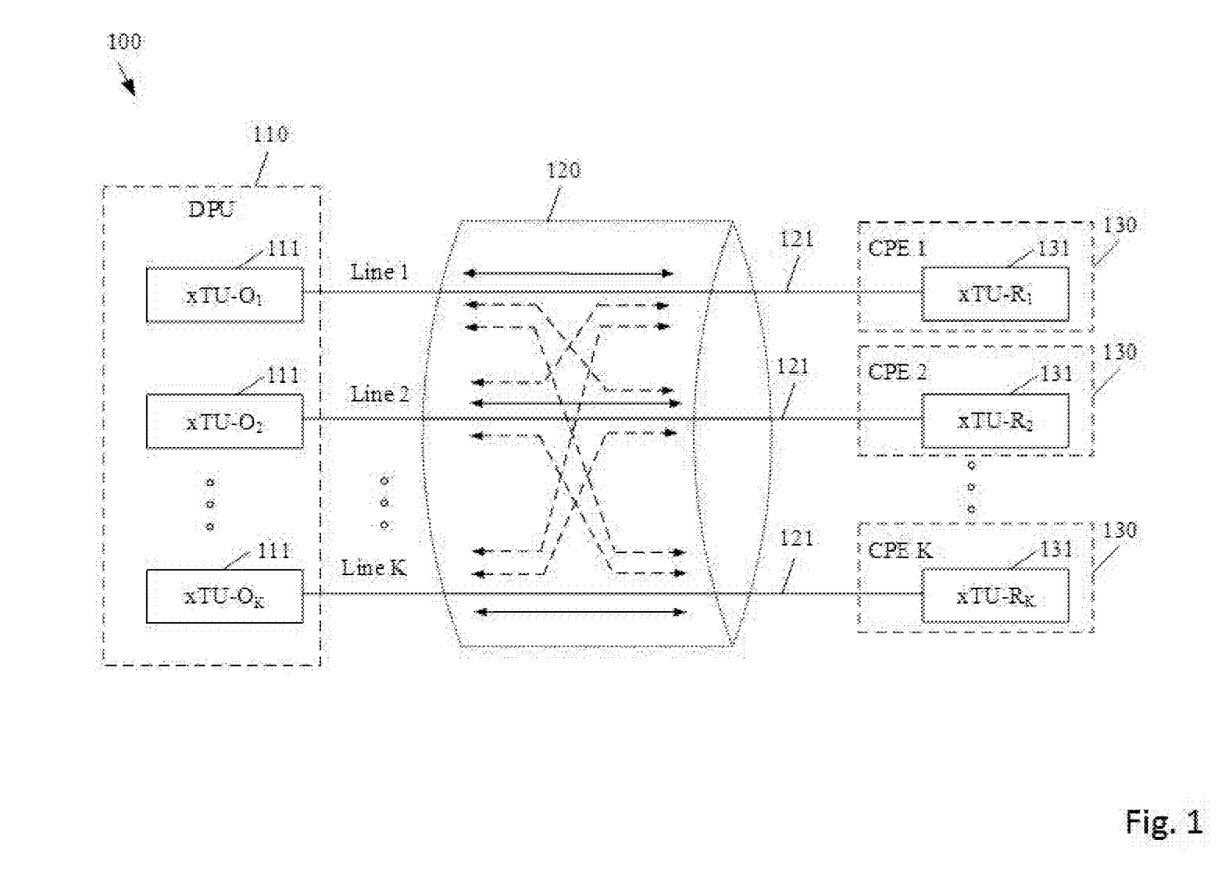
FIG. 1 is a schematic diagram of an embodiment of a DSL system.

FIG. 1 is a schematic diagram of an embodiment of a DSL system 100. The system 100 may be any DSL system as defined by the Telecommunication Standardization Sector (ITU-T). The system 100 comprises a distribution point unit (DPU) 110 coupled to a plurality of customer premise equipments (CPEs) 130 via a plurality of subscriber lines 121, where at least some of the subscriber lines 121 are bundled in a cable binder 120. The DPU 110 is located at an operator end of the system 100 such as a central office (CO), an exchange, a cabinet, or a distribution point, which is connected to a backbone network such as the Internet via one or more intermediate networks. The intermediate networks may include an optical distribution network (ODN). The CPEs 130 are shown as CPE 1 to CPE K and are located at distributed customer premises or subscriber locations and may be further connected to devices such as telephones, routers, and computers. The subscriber lines 121 are twisted or untwisted copper pairs shown as line 1 to line K. The system 100 may be configured as shown or alternatively configured as determined by a person of ordinary skill in the art to achieve similar functionalities.

The DPU 110 is any device configured to communicate with the CPEs 130. The DPU 110 terminates and aggregates DSL signals from the CPEs 130 and hands the aggregated DSL signals off to other network transports. In a downstream (DS) direction, the DPU 110 forwards data received from a backbone network to the CPEs 130. In an upstream (US) direction, the DPU 110 forwards data received from the CPEs 130 onto the backbone network. The DPU 110 comprises a plurality of xDSL office-side transceiver units (xTU-O) 111, where 'x' indicates any DSL standard. For instance, 'x' stands for 'A' in asymmetric digital subscriber line (ADSL2) or ADSL2+ systems, 'V' in very-high-bit-rate digital subscriber line (VDSL) or VDSL2 systems as described in ITU-T G.993.2, and 'F' in G.fast systems described in ITU-T G.9700 and G.9701. The xTU-Os 111 are shown as xTU-O$_1$ to xTU-O$_K$. Each xTU-O 111 comprises a transmitter and a receiver configured to transmit and receive signals over a corresponding subscriber line 121 using discrete multi-tone (DMT) modulation. DMT modulation divides a signal spectrum of a subscriber line into a number of discrete frequency bands and assigns a number of bits to each frequency band according to a channel condition of each frequency band of the subscriber line. The frequency bands are also referred to as tones or subcarriers.

In DMT modulation, a transmitter encodes data bits using forward error correction (FEC) and maps the encoded data bits to QAM constellations. Each QAM constellation is mapped to a subcarrier. Thus, the QAM constellations are in a frequency domain. The transmitter performs inverse fast Fourier transform (IFFT) to convert the frequency-domain QAM constellations into a time-domain signal, which is referred to as a DMT symbol. The transmitter pre-appends a cyclic prefix (CP) to each DMT symbol to avoid inter-symbol-interference (ISI) and inter-carrier-interference (ICI) at a receiver. The transmitter may post-append a cyclic suffix (CS) in addition to the CP, as described in G.993.2. The combination of CP and CS is called cyclic extension (CE). The transmitter transmits DMT signals carrying CP-pre-appended and CS-post-appended if used, DMT symbols to a corresponding receiver at the CPEs 130.

Upon receiving a DMT signal, a receiver searches for the beginning of a DMT symbol, discards the CE, and performs fast Fourier transform (FFT) to demodulate the DMT symbol and convert it to a frequency-domain signal. The receiver multiplies the frequency-domain signal by a frequency-domain equalizer (FEQ) sample by sample. For example, FEQ coefficients may be single-tap complex values per FFT output or tone. The receiver performs FEC decoding on the demodulated and equalized signal to recover the original data bits transmitted by a DMT transmitter.

The DPU 110 may further comprise other functional units for performing physical (PHY) layer signal processing, open system interconnection (OSI) model layer 2 (L2) and above (L2+) processing, activations of the CPEs 130, resource allocation, and other functions associated with the management of the system 100.

The CPEs 130 are any devices configured to communicate with the DPU 110. The CPEs 130 act as intermediaries between the DPU 110 and connected devices to provide Internet access to the connected devices. In a DS direction, the CPEs 130 forward data received from the DPU 110 to corresponding connected devices. In a US direction, the CPEs 130 forward data received from the connected devices to the DPU 110. Each CPE 130 comprises an xDSL remote-side transceiver unit (xTU-R) 131. The xTU-Rs 131 are shown as xTU-R$_1$ to xTU-R$_K$. Each xTU-R 131 comprises a receiver and a transmitter configured to transmit and receive signals over a corresponding subscriber line 121 using DMT modulation. The CPEs 130 may further comprise other functional units for performing PHY layer processing and other management related functions.

In the system 100, the DPU 110 and the CPEs 130 negotiate configuration parameters for data transmission in both US and DS directions during a phase known as initialization or training, before transmissions of information data during a phase known as showtime. US refers to the transmission direction from the CPEs 130 to the DPU 110, whereas DS refers to the transmission direction from the DPU 110 to the CPEs 130. Some examples of configuration parameters are channel information and bit allocations. Channel information is associated with channel conditions of the subscriber lines 121 at different tones. Bit allocation may include a number of bits to be allocated or loaded at each frequency tone of a DMT symbol based on the channel conditions.

Figure 2:
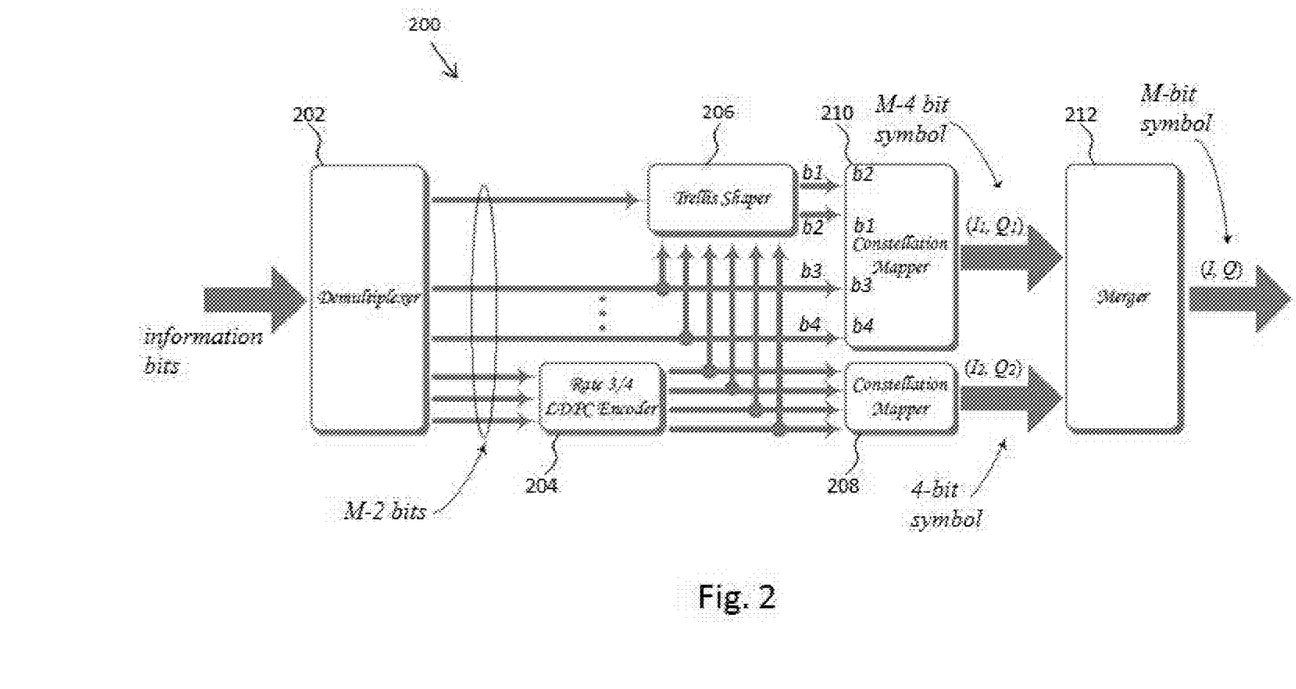
FIG. 2 is a schematic diagram of an embodiment of a transmitter suitable for use with the DSL system of FIG. 1.

FIG. 2 illustrates a transmitter 200 suitable for use with a DSL system such as, for example, the DSL system 100. Specifically, the transmitter 200 may be similar to the transceiver units 111, 131 of FIG. 1. The transmitter 200 may be disposed on a CPE side of the DSL system 100 and/or on the CO side of the DSL system 100. As shown, the transmitter 200 includes a demultiplexer (DeMux) 202, a rate encoder 204, a trellis shaper 206, a first constellation mapper 208, a second constellation mapper 10, and a merger module 212.

As shown in FIG. 2, the demultiplexer 202 is configured to receive information bits (e.g., a bitstream) in a serial, which is represented by a large arrow entering the left side of the demultiplexer 202. The demultiplexer 202, which is a serial-to-parallel (S/P) converter, converts the information bits from serial to parallel, which is represented by the small arrows leaving the right side of the demultiplexer 202. The demultiplexer outputs M number of bits at a time, where Mis a positive integer greater than or equal to 6. In some embodiments, Mis smaller than or equal to 15.

For purposes of discussion, assume that Mis equal to 8 bits. Therefore, the transmitter 200 will output an 8-bit symbol. As shown in FIG. 2, the demultiplexer 202 outputs M−2 bits, which in this example is 6 bits (8 bits−2 bits=6 bits). The 3 bits fed into the rate encoder 204 will be referred to as the 3 least significant bits (LSBs), the 1 bit fed into the trellis shaper 206 will be referred to as the most significant bit (MSB), and the other bits will be referred to as the remaining or additional bits.

The 3 least significant bits are transmitted from the demultiplexer 202 to the rate encoder 204. The rate encoder 204 encodes the bits such that the output of the rate encoder 204 has one more bit than the input. In the illustrated example, the 3 least significant bits are encoded into 4 bits. The rate encoder 204 outputs the 4 bits to the first constellation mapper 208. While the rate encoder 204 of FIG. 2 is depicted as a rate-¾ LDPC encoder, the rate encoder 204 may have a different encoding rate in other embodiments.

For example, the rate encoder 204 may have a ⅔ LDPC encoder that outputs 3 coded bits for every 2 input bits. In this case, 2 least significant bits are transmitted from the demultiplexer 202 to the rate encoder 204. Alternatively, the rate encoder 204 may have a ½ LDPC encoder that outputs 2 bits for every 1 input bit. In this case, 1 least significant bit is transmitted from the demultiplexer 202 to the rate encoder 204.

The most significant bit is transmitted from the multiplexer 202 to the trellis shaper 206. The trellis shaper 206 encodes the bit such that the output of the trellis shaper 206 has one more bit than the input. In the illustrated example, the most significant bit is encoded into 2 bits. While the trellis shaper 206 is depicted as a rate-½ encoder in FIG. 2, the trellis shaper 206 may have a different encoding rate in other embodiments. The trellis shaper 206 outputs the 2 bits to the second constellation mapper 210.

The remaining bits from the demultiplexer 202 (e.g., the bits other than the 3 least significant bits and the most significant bit, which in the illustrated example means any bits in excess of 6) are transmitted to the second constellation mapper 210 and are also fed into the trellis shaper 206. In the illustrated example, there are 2 remaining bits. However, it should be recognized that the number of remaining bits (e.g., extra or additional bits) will increase as the value of M increases. For example, if M is increased to 10, there will be 4 additional bits transmitted to the second constellation mapper 210 and also input into the trellis shaper 206. As shown in FIG. 2, the trellis shaper 206 utilizes the 2 remaining bits during encoding to generate the 2 bits input into the second constellation mapper 210.

The 4 bits output by the rate encoder 204 are fed into the first constellation mapper 208. The first constellation mapper 208 uses those 4 bits to select a first 2-D point from a Gray-labeled constellation of 16 symbols as described in E. Eleftheriou, X. Hu, S. Ölçer, M. Sorbara, M. Eyvazkhani, G.gen, "An information-theoretic framework for comparing the coding schemes proposed for G.dmt.bis and G.lite.bis," Temporary Document CF-070, Study Group 15, Irvine, Calif., 9 C 13 Apr. 2001, which is incorporated by reference. The 2-D point is a point described by integer coordinates ($I_2$, $Q_2$) in a complex plane. The 2-D point may be a point represented by, for example, −3, +3j, −1, +4j, or by some other integer coordinates.

The bits output by the trellis shaper 206 are fed into the second constellation mapper 210 along with the remaining bits from the demultiplexer 202. Prior to performing any mapping function, the second constellation mapper 210 performs an interleaving function by swapping the positions of the some of the bits received from the trellis shaper 206. In an embodiment, the positions of two of the bits are interchanged. To illustrate the point, assume that the trellis shaper 206 outputs a first bit, b1, and a second bit, b2, as shown in FIG. 2. In addition, assume that the demultiplexer 202 outputs a first remaining bit, b3, and a second remaining bit, b4, as shown in FIG. 2. When bits b1 and b2 are received, the second constellation mapper 210 interleaves these bits by changing their position. In other words, a position of the two bits, b1 and b2, is swapped such that b2 is now on top of b1 as shown. The remaining bits, b3 and b4, maintain their positions. So, the second constellation mapper 210 receives four bits in the order b1, b2, b3, and b4, and performs an interleaving function to put the bits in the order b2, b1, b3, and b4.

The second constellation mapper 210 uses the 4 bits in the rearranged order to select a second 2-D point from a Gray-labeled constellation of 16 symbols. If more than four bits were received, a constellation having further symbols may be used (e.g., for 5 bits a constellation of 32 symbols would be used, etc.). The second 2-D point is a point described by integer coordinates ($I_1$, $Q_1$) in a complex plane. The second 2-D point may be a point represented by, for example, −3, +3j, −1, +4j, or by some other integer coordinates.

The first and second 2-D points ($I_1$, $Q_1$ and $I_2$, $Q_2$) are merged together by the merger module 212 to generate a symbol (e.g., an 8 bit symbol created by the combination of the two 4 bit symbols). The symbol is used to generate a constellation mapping for transmitting data in a DSL system. In the example provided herein, the symbol is an 8 bit symbol. The symbol is a third point described by integer coordinates (I, Q) in a complex plane. By way of example, the first and second selected 2-D constellation points are merged into one (third) point by the merger module 212 as follows. If the LSBs select the constellation point ($x_c$, $y_c$) and the MSB (and possibly the remaining bits) select the constellation point (X, Y), then the merged 2-D point is calculated by the merger module 212 as (4X+$x_c$, 4Y+$y_c$). Because of the interleaving, the point identified by the merger module 212 is different from what would have been output without the interleaving.

In the receiver, a likelihood ratio is first computed for all the M bits that were input to the constellation mappers 208 and 210. The likelihood ratio of a given bit is the ratio of the probability of it being '1' to the probability of it being '0'. To simplify processing, the natural logarithm of the likelihood ratio (LLR) could be used instead of the likelihood ratio. An estimate of the MSB (e.g., the input to the trellis shaper 206) is then recovered from the LLR of the two MSBs b1 and b2 using the parity-check matrix of the convolutional encoder in the trellis shaper. In order to obtain the correct LLRs for b1 and b2, a de-interleaver is used to undo the swapping of bits b1 and b2 that was performed in the constellation mapper 210. Then the LLRs of the remaining bits, that is, for all bits at the input to the constellation mappers 208 and 210 excluding bits b1 and b2, are processed by a decoder for the code generated by the rate encoder 204 to recover an estimate of the remaining M−3 bits at the output of the demultiplexer 202. These M−3 bit estimates are then combined with the estimate of the MSB to form an estimate of the M−2 bits at the output of the demultiplexer 202.

Figure 3A:
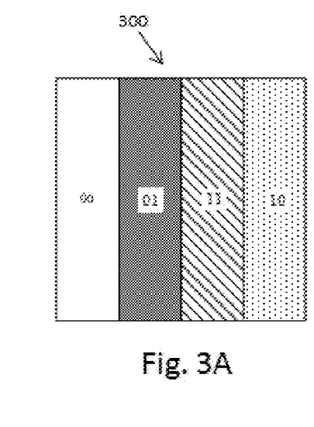
FIGS. 3A-3B depict conventional constellations for even and odd values of a symbol.
Figure 3B:
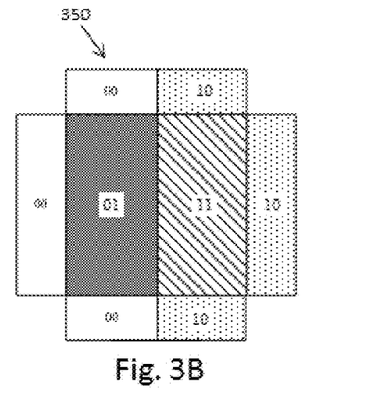
Figure 4A:
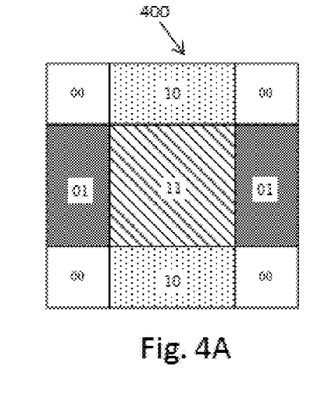
FIGS. 4A-4B depict an embodiment of constellations for even and odd values of a symbol generated by the transmitter of FIG. 2.
Figure 4B:
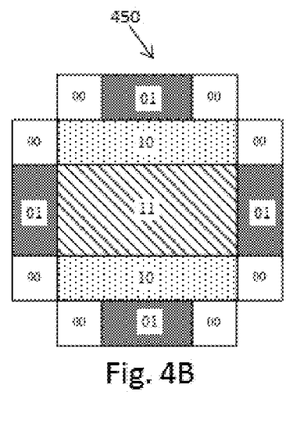

The benefit of using the transmitter 200 of FIG. 2 to generate constellations is illustrated by comparing the conventional constellation labeling of FIGS. 3A-3B to the constellation labeling of FIGS. 4A-4B which is achieved through interleaving. FIG. 3A depicts a Gray code-labeled constellation 300 for an even M (e.g., M is 8) while FIG. 3B depicts a Gray code-labeled constellation 350 for an odd M (e.g., M is 9). Each of the full constellations 300, 350 is divided into several sub regions, each of which is labeled by the shaping bits, i.e., the 2 MSBs from the symbol provided by the merger module (e.g., the merger module 212 of FIG. 2). Points with shaping bits 00 and 10 are located in the outer regions, but the action of a nominal trellis shaper may also cause selection of points from the inner regions (characterized by points labeled with bits 01 and 11) when the information bits would have otherwise selected points from these outer regions. But simply selecting points in regions 01 and 11 does not yield any shaping gain since the points selected by the trellis shaper will be uniformly distributed in regions 01 and 11. Therefore, a Gaussian-like distribution on the selected points will not be achieved.

In order to obtain shaping gain from a Gray code-labeled constellation, two of the M−4 MSBs are interleaved and encoded so that the shaping bits are no longer located in the MSBs. This effectively modifies the constellation labeling of FIGS. 3A-3B to the constellation labeling 400, 450 shown in FIGS. 4A and 4B for even and odd cases, respectively. This new labeling scheme ensures different average energies for sub regions labeled with different shaping bits, the average energy decreasing monotonically in the order 00, 01/10, to 11. As pointed out in S.A. Tretter, "Constellation shaping, nonlinear precoding, and trellis coding for voiceband telephone channel modems with Emphasis on ITU-T Recommendation V.34," Chapter 4.2, Shaping on regions, DOI 10.1007/978-1-4615-0989-9, Kluwer Academic Publishers, 2002, which is incorporated herein by reference, this characteristic results in a regional shaping gain. The shaping effect for even M as shown in FIG. 4A will be somewhat more pronounced than that for odd M as shown in FIG. 4B because the central portion of the constellation for the latter is partitioned into rectangular sub regions and is thus less Gaussian-like than the square sub regions for the former.

Figure 5:
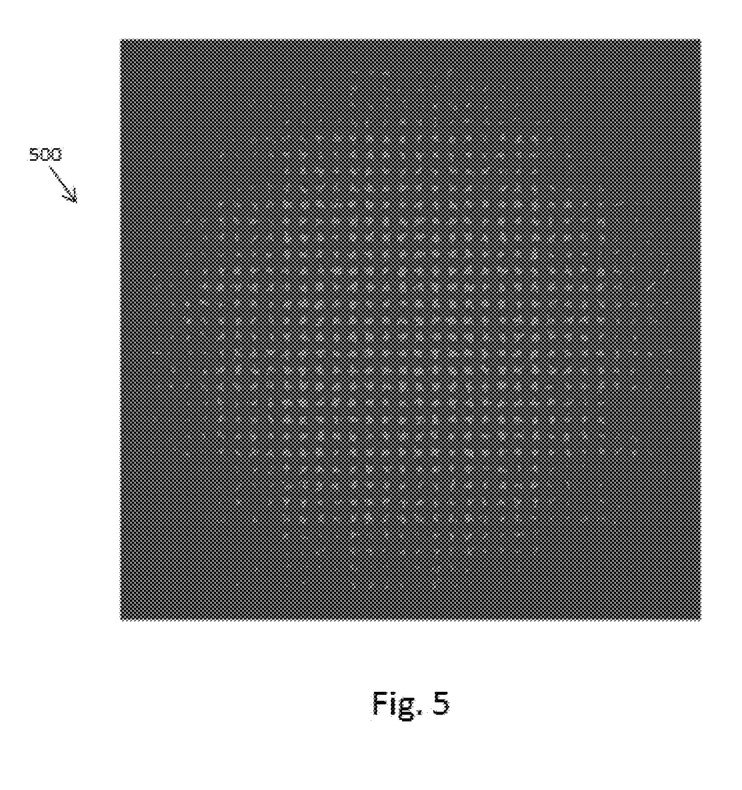
FIG. 5 is an example of a two-dimensional (2-D) truncated Gaussian-like distribution on selected constellation points implemented using the trellis shaping of FIG. 4A.

Implementation of the trellis shaping described in FIGS. 4A-4B produces a 2-D truncated Gaussian-like distribution on the selected constellation points, with points selected more frequently from near the origin and less frequently far away from it. An example of this for a shaped 1024-QAM constellation 500 is illustrated in FIG. 5. The distribution demonstrated in FIG. 5 does not resemble a purely circular Gaussian distribution, but rather one modified by the pattern of FIG. 4A.

Figure 6:
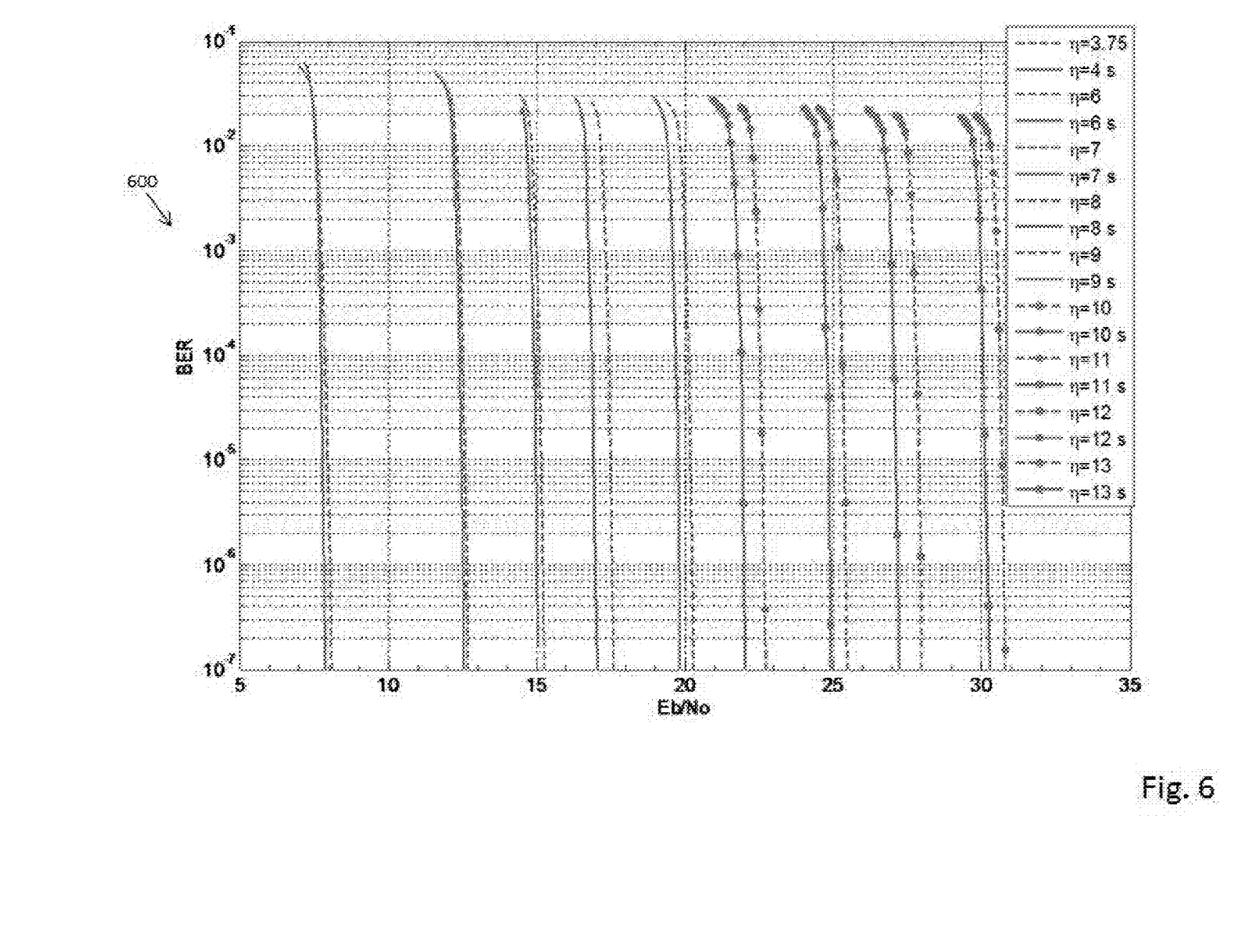
FIG. 6 is a graph illustrating the benefits of trellis shaping using the transmitter of FIG. 2.

The performance of the shaping method and LDPC code mentioned above have been simulated for various QAM constellations. FIG. 6 includes a graph 600 illustrating the benefits of using the inventive shaping methods described herein. The graph 600 shows a comparison of the bit error rate (BER), which is on the y-axis, relative to the energy per bit normalized (Eb/No), which is on the x-axis, for the different spectral efficiencies η. The solid curves are for shaped constellations and the dashed curves are without shaping. Because the comparisons are made at the same spectral efficiency η, the shaping gains obtained are net shaping gains, which while not shown in FIG. 6, are typically denoted as $\gamma_s$ (net). With shaping, a spectral efficiency of η uses a constellation of size $2^{n+2}$. On the other hand, when shaping is not used, a spectral efficiency of η only uses a constellation of size $2^{n+1}$. Therefore, comparisons for stating the shaping gain at the same spectral efficiency have been made this way. The exception to this is the case for which a constellation of size 32 is used without shaping. The LCM encoder described in "LDPC coding proposal for G.dmt.bis and G.lite.bis," by E. Eleftheriou and S. Ölçer, ITU-T Temporary Document CF-061, Study Group 15/4, Clearwater, Fla., 8-12 Jan. 2001, which is incorporated herein by reference, does not readily accommodate a size-32 constellation. So, for that constellation LCM is not used. Rather, the system is operated with the LDPC encoder encoding all information bits and then Gray-mapping the output directly to the constellation. This results in a value of η equal to (¾)*5=3.75, which is compared with a shaped constellation at η=4. Table I lists the shaping gain for values of η from 4 to 13 at a BER of $10^{-7}$. The corresponding QAM order is also listed. The case for which η=5 has been omitted because the shaping method does not accommodate that value of η.

TABLE I

Shaping gain versus spectral efficiency.

| η | 4 | 6 | 7 | 8 | 9 | 10 | 11 | 12 | 13 |
|---|---|---|---|---|---|----|----|----|----|
| $\gamma_{s(net)}$/dB | 0.20 | 0.11 | 0.24 | 0.52 | 0.43 | 0.70 | 0.56 | 0.70 | 0.56 |
| QAM order | $2^6$ | $2^8$ | $2^9$ | $2^{10}$ | $2^{11}$ | $2^{12}$ | $2^{13}$ | $2^{14}$ | $2^{15}$ |

It is easily seen that: 1) the shaping gains for η>=8 exceed those for η<8; 2) the shaping gains for even η are generally better than for odd η especially when η>=8. For example, the shaping gains for η=10 and η=12 are both 0.7, while only 0.11 dB is obtained for η=6. Also observe that the shaping gain for η=13 is 0.14 dB smaller than it is for η=12. Mean values of 0.18 dB and 0.58 dB shaping gain are obtained for η<8 and odd η>=8, respectively. For even and odd cases (both η>=8), mean values are 0.64 dB and 0.52 dB shaping gain respectively.

Figure 7:
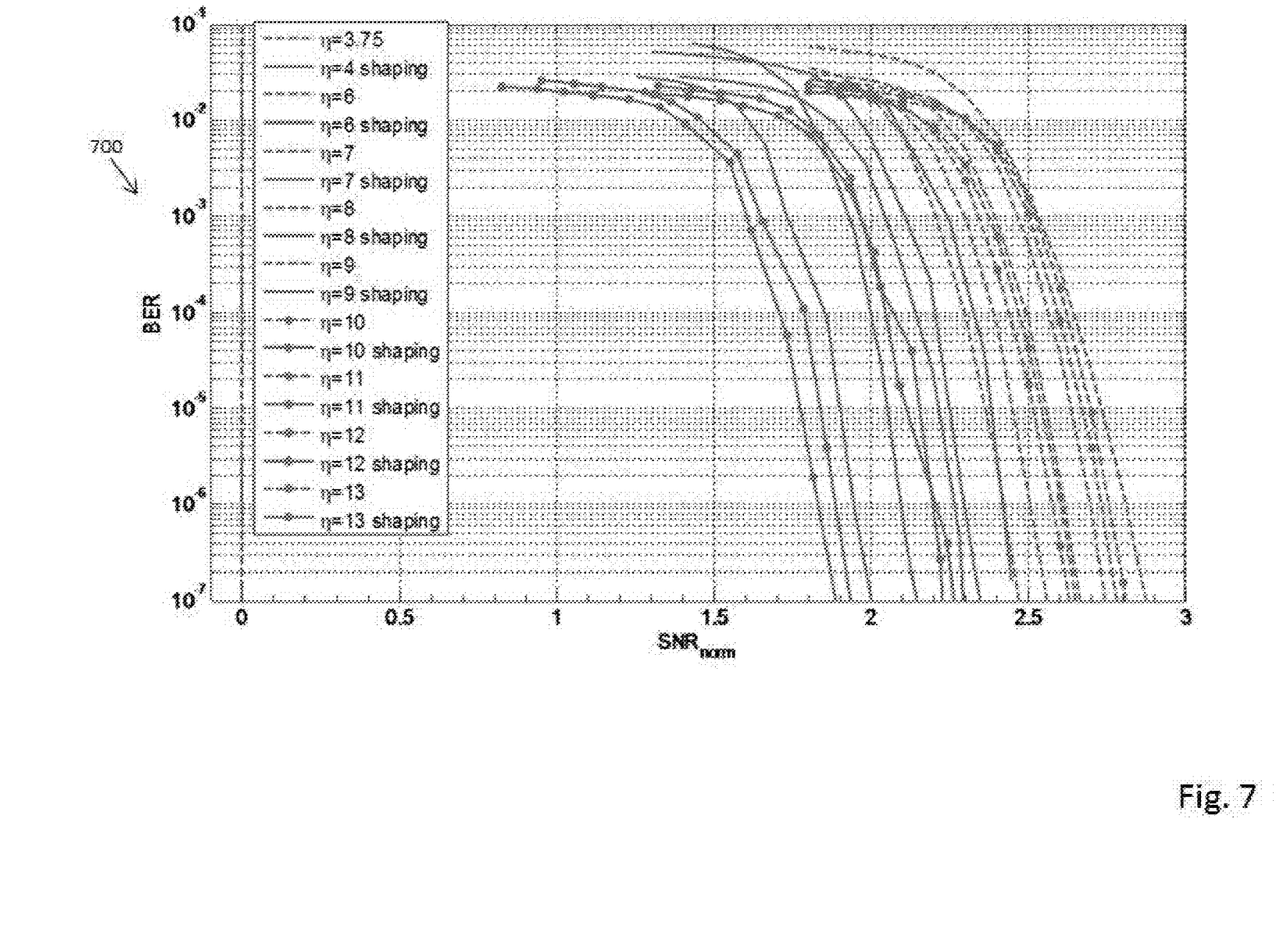
FIG. 7 is a graph providing a perspective on overall shaping gain realized by using the transmitter of FIG. 2.

FIG. 7 includes a graph 700 providing a perspective on overall shaping gain by plotting BER, which is on the y-axis, against normalized SNR ($SNR_{norm}$), which is on the x-axis, as disclosed in Chapter 4.2, "Shaping on regions," previously noted above. As shown, the curves with shaping are shifted to the left of the curves without shaping, and the reduced difference between each curve and the dashed vertical line at $SNR_{norm}=0$, representing the Shannon limit is evident.

The combination of trellis shaping with LDPC-coded modulation for DMT systems with uniformly-spaced constellations as disclosed herein is the inventive concept. The shaping gain is obtained across the subcarriers adaptively with different constellation sizes and power. Trellis shaping with coded modulation has been described in T. N. Zogakis, J. T. Aslanis, and J. M. Cioffi, "A coded and shaped discrete multitone system," Communications, IEEE Transactions on 43.12 (1995): 2941-2949, 1995, which is incorporated herein by reference, but that system shows how to combine trellis shaping with trellis-coded modulation using circular constellations, rather than for the block-coded modulation with square and rectangular constellations as described herein.

Figure 8:
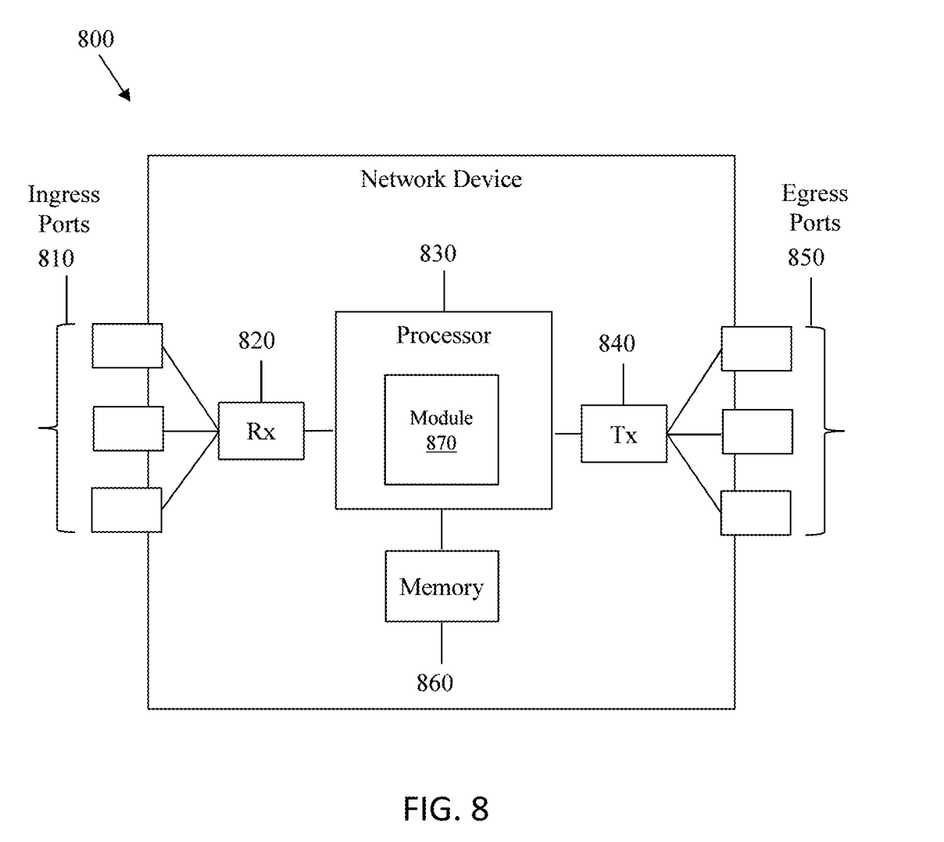
FIG. 8 is a network component suitable for implementing the inventive features and methods disclosed herein.

FIG. 8 is a schematic diagram of a network device 800 according to an embodiment of the disclosure. The device 800 is suitable for implementing the disclosed embodiments as described below. The device 800 comprises ingress ports 810 and receiver units (Rx) 820 for receiving data; a processor, logic unit, or central processing unit (CPU) 830 to process the data; transmitter units (Tx) 840 and egress ports 850 for transmitting the data; and a memory 860 for storing the data. The device 800 may also comprise optical-to-electrical (OE) components and electrical-to-optical (EO) components coupled to the ingress ports 1010, the receiver units 820, the transmitter units 840, and the egress ports 850 for egress or ingress of optical or electrical signals.

The processor 830 is implemented by hardware and software. The processor 830 may be implemented as one or more CPU chips, cores (e.g., as a multi-core processor), field-programmable gate arrays (FPGAs), application specific integrated circuits (ASICs), and digital signal processors (DSPs). The processor 830 is in communication with the ingress ports 810, receiver units 820, transmitter units 840, egress ports 850, and memory 860. The processor 830 comprises a module 870 that performs trellis shaping on LDPC-coded modulation DMT systems. The module 870 implements the disclosed embodiments described above.

For instance, the module 870 implements, for example, one or more of the encoding, shaping, constellation mapping, interleaving, and/or merging functions as described herein. The inclusion of the module 870 therefore provides a substantial improvement to the functionality of the device 800 and effects a transformation of the device 800 to a different state. In an embodiment, the module 870 is implemented as instructions stored in the memory 860 and executed by the processor 830.

The memory 860 comprises one or more disks, tape drives, and solid-state drives and may be used as an overflow data storage device, to store programs when such programs are selected for execution, and to store instructions and data that are read during program execution. The memory 860 may be volatile and/or non-volatile and may include read-only memory (ROM), random-access memory (RAM), ternary content-addressable memory (TCAM), and static random-access memory (SRAM), for example.

Figure 9:
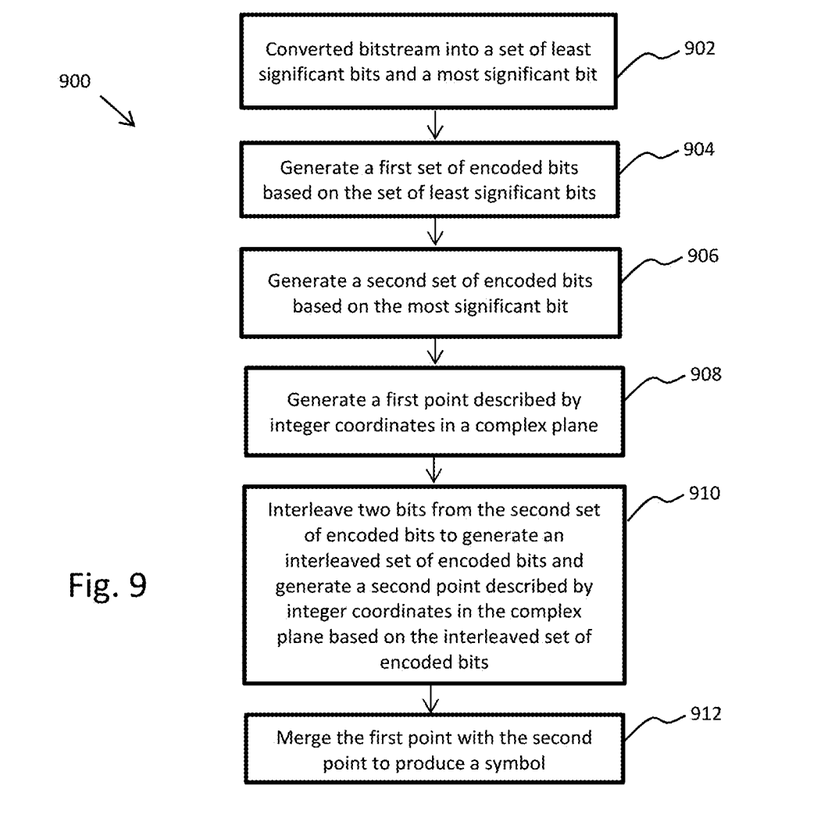
FIG. 9 is a flowchart of a method of generating a constellation mapping in the transmitter of FIG. 2.

FIG. 9 is a flowchart of a method 900 of generating a constellation mapping in a transmitter (e.g., transmitter 200 of FIG. 2). The method 900 is implemented when, for example, constellation mapping is desired in order to facilitate data transmission in a DSL system. At block 902, a bitstream is converted into a set of least significant bits and a most significant bit by a serial to parallel converter (e.g., the demultiplexer 202 of FIG. 2). At block 904, a first set of encoded bits is generated by a first rate encoder (e.g., rate encoder 204) based on the set of least significant bits. In an embodiment, the first set of encoded bits contains one more bit than the set of least significant bits. At block 906, a second set of encoded bits is generated by a second rate encoder (e.g., trellis shaper 206) based on the most significant bit. At block 908, a first point described by integer coordinates in a complex plane is generated by a first constellation mapper (e.g., first constellation mapper 208 of FIG. 2), based on the first set of encoded bits. At block 910, two bits from the second set of encoded bits are interleaved by a second constellation mapper (e.g., second constellation mapper 210 of FIG. 2) to generate an interleaved set of encoded bits, and then a second point described by integer coordinates in the complex plane is generated based on the interleaved set of encoded bits. At block 912, the first point is merged with the second point by a merging device (e.g., merger module 212 of FIG. 2) to produce a symbol. The symbol represents a point described by integer coordinates in the complex plane.

The terms network "element," "node," "component," "module," and/ or similar terms may be interchangeably used to generally describe a network device and do not have a particular or special meaning unless otherwise specifically stated and/or claimed within the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In an embodiment, a transmitter in a Digital Subscriber Line (DSL) system includes means for generating a first set of encoded bits using a set of least significant bits, wherein the first set of encoded bits contains at least one more bit than the set of least significant bits, means for generating a second set of encoded bits using a most significant bit and the first set of encoded bits, means for generating a first point described by integer coordinates in a complex plane based on the first set of encoded bits obtained from the rate encoder, means for generating a second point described by integer coordinates in the complex plane after interleaving two bits from the second set of encoded bits obtained from the trellis shaper, and means for merging the first point with the second point to generate a symbol, wherein the symbol represents a third point described by integer coordinates in the complex plane.

In an embodiment, a method of generating a constellation mapping in a transmitter includes means for converting a bitstream into a set of least significant bits and a most significant bit, means for generating a first set of encoded bits based on the set of least significant bits, wherein the first set of encoded bits contains one more bit than the set of least significant bits, means for generating a second set of encoded bits based on the most significant bit, means for generating a first point described by integer coordinates in a complex plane based on the first set of encoded bits, means for interleaving two bits from the second set of encoded bits to generate an interleaved set of encoded bits and generating a second point described by integer coordinates in the complex plane based on the interleaved set of encoded bits, and means for merging the first point with the second point to produce a symbol, wherein the symbol represents a third point described by integer coordinates in the complex plane.

In an embodiment, a transmitter in a Digital Subscriber Line (DSL) system includes means for converting a bitstream into a set of least significant bits, a most significant bit, and at least one extra bit, means for generating a first set of encoded bits using the set of least significant bits, wherein the first set of encoded bits contains at least one more bit than the set of least significant bit, means for generating a second set of encoded bits using the most significant bit, the at least one extra bit, and the first set of encoded bits, means for generating a first point described by integer coordinates in a complex plane based on the first set of encoded bits obtained from the rate encoder, means for generating a second point described by integer coordinates in the complex plane based on the second set of encoded bits and the at least one extra bit after interleaving two bits from the second set of encoded bits, and means for merging the first point with the second point to generate a symbol, wherein the symbol represents a point described by integer coordinates in a complex plane.

From the foregoing, those skilled in the art will appreciate that a network administrator (e.g., a person and/or computer software) is able to check for overlaps in the physical positions of traversed network elements even when different domains are included in the network. Because location-based risk identifiers are used, any need to cross-reference or map the identifiers of one domain in a network to dissimilar identifiers of another domain is eliminated.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A transmitter in a Digital Subscriber Line (DSL) system, comprising:
   a memory storage comprising instructions; and
   a processor in communication with the memory, wherein the processor executes the instructions to:
      convert a bitstream into a set of least significant bits, a most significant bit, and at least one extra bit;
      generate a first set of encoded bits using the set of least significant bits, the first set of encoded bits comprising at least one more bit than the set of least significant bits;
      generate a second set of encoded bits using the most significant bit, the at least one extra bit, and the first set of encoded bits;
      generate a first point described by integer coordinates in a complex plane based on the first set of encoded bits;
      generate a second point described by integer coordinates in the complex plane based on the second set of encoded bits and the at least one extra bit after interleaving two bits from the second set of encoded bits; and
      merge the first point with the second point to generate a symbol, wherein the symbol represents a third point described by integer coordinates in the complex plane.

2. The transmitter of claim 1, wherein the interleaving comprises swapping a position of the two bits in the second set of encoded bits.

3. The transmitter of claim 1, wherein the interleaving comprises swapping a position of the two bits in the second set of encoded bits while positions of all remaining bits are unchanged.

4. The transmitter of claim 1, wherein the symbol contains more bits than the set of least significant bits and the most significant bit combined.

5. The transmitter of claim 1, wherein the first set of encoded bits is generated using a Low Density Parity Check (LDPC)¾rate encoder, and wherein the second set of encoded bits is generated using a ½rate trellis shaper.

6. The transmitter of claim 1, wherein a Gray coded bit mapping is applied to generate the first point and the second point, and wherein each of the first point and the second point is two-dimensional.

7. The transmitter of claim 1, wherein the symbol is used to generate a constellation mapping utilized for transmitting data in the DSL system.

8. A method of generating a constellation mapping in a transmitter, comprising:
   converting a bitstream into a set of least significant bits, a most significant bit, and at least one extra bit;
   generating a first set of encoded bits using the set of least significant bits, the first set of encoded bits comprising one more bit than the set of least significant bits;
   generating a second set of encoded bits using the most significant bit, the at least one extra bit, and the first set of encoded bits;
   generating a first point described by integer coordinates in a complex plane based on the first set of encoded bits;
   interleaving two bits from the second set of encoded bits to generate an interleaved set of encoded bits;
   generating a second point described by integer coordinates in the complex plane based on the interleaved set of encoded bits, the second set of encoded bits, and the at least one extra bit; and
   merging the first point with the second point to produce a symbol, wherein the symbol represents a third point described by integer coordinates in the complex plane.

9. The method of claim 8, wherein the interleaving comprises swapping a position of the two bits in the second set of encoded bits.

10. The method of claim 8, wherein the interleaving comprises swapping a position of the two bits in the second set of encoded bits while positions of all remaining bits are unchanged.

11. The method of claim 8, further comprising converting the bitstream into one or more additional bits and using the one or more additional bits for constellation mapping and trellis shaping.

12. The method of claim 8, wherein a Gray coded bit mapping is used to generate the first point and the second point, and wherein each of the first point and the second point is two-dimensional.

13. The method of claim 8, wherein the converting the bitstream into the set of least significant bits and the most significant bit is performed by a processor, wherein the generating the first set of encoded bits and the second set of encoded bits is performed by the processor, wherein the generating the first point is performed by the processor, wherein the interleaving the two bits is performed by the processor, and wherein the merging the first point with the second point to produce the symbol is performed by the processor.

14. The method of claim 8, further comprising using the symbol to generate a constellation mapping utilized for transmitting data in a Digital Subscriber Line (DSL) system.

15. A Digital Subscriber Line (DSL) apparatus, comprising:
   a memory storage comprising instructions; and
   a processor in communication with the memory, wherein the processor executes the instructions to:
      convert a bitstream into a set of least significant bits, a most significant bit, and at least one extra bit, the set of least significant bits and the most significant bit comprising at least four total bits;
      generate a first set of encoded bits using the set of least significant bits, the first set of encoded bits comprising at least one more bit than the set of least significant bits;
      generate a second set of encoded bits using the most significant bit, the at least one extra bit, and the first set of encoded bits;
      generate a first point described by integer coordinates in a complex plane based on the first set of encoded bits;
      generate a second point described by integer coordinates in the complex plane based on the second set of encoded bits and the at least one extra bit after interleaving two bits from the second set of encoded bits; and merge the first point with the second point to generate a symbol, wherein the symbol represents a third point described by integer coordinates in the complex plane.

16. The DSL apparatus of claim 15, wherein the interleaving comprises swapping a position of the two bits in the second set of encoded bits.

17. The DSL apparatus of claim 15, wherein the interleaving comprises swapping a position of the two bits in the second set of encoded bits while positions of all remaining bits remain the same.

18. The DSL apparatus of claim 15, wherein the first set of encoded bits is generated using a Low Density Parity Check (LDPC) ¾rate encoder, and wherein the second set of encoded bits is generated using a ½rate trellis shaper.

19. The DSL apparatus of claim 15, wherein a Gray coded bit mapping is applied to generate the first point and the second point, and wherein the first point and the second point are two-dimensional.

20. The DSL apparatus of claim 15, wherein the symbol is used to generate a constellation mapping utilized for transmitting data in the DSL system.

\* \* \* \* \*